(12) United States Patent
Michael et al.

(10) Patent No.: US 6,436,715 B1
(45) Date of Patent: Aug. 20, 2002

(54) METHOD FOR DETERMINING SILICONE CONCENTRATIONS

(75) Inventors: Günther Michael, Karlstein; Arndt Müller, Dreieich, both of (DE)

(73) Assignee: Degussa Huls AG, Frankfurt am Main (DE)

( * ) Notice: Subject to any disclaimer, the term of this patent is extended or adjusted under 35 U.S.C. 154(b) by 144 days.

(21) Appl. No.: 09/607,952

(22) Filed: Jun. 30, 2000

Related U.S. Application Data
(60) Provisional application No. 60/142,044, filed on Jul. 2, 1999.

(30) Foreign Application Priority Data

Jul. 1, 1999 (DE) ............................................ 199 30 141

(51) Int. Cl.$^7$ .............................................. G01N 33/00
(52) U.S. Cl. ........................... 436/72; 436/173; 436/177
(58) Field of Search ............................ 436/72, 173, 177

(56) References Cited

FOREIGN PATENT DOCUMENTS

| JP | 05001150 | 1/1993 |
| JP | 1028207 A | 10/1998 |

OTHER PUBLICATIONS

Qi, Zhenghian; Shen, Wenbin, "Determination of amount of hydrogen in polyhydrosiloxanes by 1H–NMR with internal standards", 1995, Nanjing daxue xuebao, Ziran Kexue (1994), 30(2), 372–376.*

Fux, Peirce, "Determination of trace amounts of polydimenthylsiloxane in extracts of chemicals by proton NMR spectroscopy". Analyst (London) (1990), 115(2), 179–183.*

Parsonage, John; Vidgeon, Edward, A, "Determination of molecular weight of polyorganosiloxanes by proton NMR using anisotropic solcent induced shifts", Chem. Ind. (London) (1987) (14), 488.*

Anhoury, M; Crooy, P; De Neys, R; Laridant, A, "Rapid determination of dimethyl polysiloxane by proton magnetic resonance spectroscopy", J. Pharm. SCi (1976), 65(4), 590–2.*

* cited by examiner

Primary Examiner—Jeffrey Snay
Assistant Examiner—Samuel P. Siefke
(74) Attorney, Agent, or Firm—Pillsbury Winthrop LLP

(57) ABSTRACT

A method for the quantitative determination of silica oil or siloxane concentrations present in trace quantities in silicas or pyrogenic oxides by the quantitative evaluation of proton spectra is presented. The silica or pyrogenic oxide of interest is dispersed in a suitable organic solvent and the phases are then separated. The liquid phase is evaporated to a dry residue which is then redissolved in a deuterated solvent. The redissolved residue is evaluated quantitatively by proton NMR spectroscopy to determine the concentration of silica oil or siloxane by measuring the integral of the methyl silyl protons present in the $_1$H spectra and comparing same to the integral of the deuterated solvent.

12 Claims, 3 Drawing Sheets

Silicone oil in an extract of Aerosil R 805

A variety of Aerosil R 805 samples with different silicone oil concentrations

METHOD FOR DETERMINING SILICONE CONCENTRATIONS

The present application claims priority under 35 U.S.C. §119 to German application 199 30 141.7, filed on Jul. 1, 1999. The application also claims the benefit of U.S. Provisional Application No. 60/142,044, filed Jul. 2, 1999.

BACKGROUND OF THE INVENTION

1. Field of the Invention

The present invention relates to a quantitative method for determining trace amounts of silicone oil and siloxane in fumed silica or pyrogenic oxides. The present invention involves both a procedure for preparing the sample for analysis and a method of analyzing the prepared sample by proton nuclear magnetic resonance spectroscopy. The present technique results in greatly improved sensitivity in the determination of the concentration of silicone oil and/or siloxane in fumed silica.

2. Background Information

It has been known that even trace amounts of silicone oil and/or siloxane in silica formulations for use in lacquer, paint or adhesive compositions, or other compositions and applications related to "paintability" and/or adhesion, can cause serious adhesion problems for such coatings. These problems occur even when the silicone oil or siloxane impurities are present in very small or trace amounts, on the level of ppm (parts per million). These problems are due to the silicone oil or siloxanes acting as, for instance, phase separators in the paint or adhesive.

Silica formulations that are functionalized with siloxanes are generally not used in applications which require high levels of adhesiveness. However, in the mass production of post-treated silica it is almost inevitable that traces of siloxane will be present in silica formulations, for instance, resulting from contamination due to product changeover in a production line.

Until the present invention, no analytical technique was known that allowed for direct quantitative measurement of the siloxane traces in the silica. Conventional methods such as infrared spectroscopy are not sensitive enough. The technique of proton nuclear magnetic resonance spectroscopy ($^1$H-NMR), which includes putting the silica in a deuterated solvent, fails to produce quantitatively measurable spectra because of signal broadening. Recently, attempts have been made with more expensive, very new methods—such as TOF-SIMS (Time of Flight-Secondary Ion Mass Spectrometry) to indicate the presence of siloxane traces on a cleaned silica surface. This indication was only successful on a damaged paint layer. Apparently the concentration of siloxane in the silica gel is too low to be measured by this technique.

SUMMARY OF THE INVENTION

A method for the quantitative determination of silicone oil or siloxanes in trace quantities in silicas or pyrogenic oxides by the quantitative evaluation of $^1$H-NMR spectra by dispersing the silica or pyrogenic oxide in an organic solvent, then after isolating the solids, evaporating the clear phase to dryness and after taking up the residue in a deuterated solvent, quantitatively evaluating the silicone oil or siloxane via the integral of the methyl silyl protons indicated on the $^1$H-NMR spectrum.

The present invention, however, allows for the first time quantitative determination of silicone oil or siloxane traces in silica with high sensitivity. This method can be used in special situations and in a production environment can be a criterion for barring release or releasing materials for production use. Use of the present method can help to mitigate or avoid paint damages, of a significant size (sometimes well above 1 million DM) beforehand.

In order to obtain quantitative measurements in the desired sensitivity range, it is necessary to follow the steps of the sample preparation method outlined herein. The separation of the solid silica from the dissolved silica isolates the silicone oil and siloxane species from the silica. The subsequent evaporation and redissolution steps result in a solution with a higher concentration of the species of interest.

Since silica can adsorb certain amounts of siloxane reversibly, the total siloxane concentration is determined with the aid of a calibration line, which is determined with the use of silica samples that have a known concentration of siloxane.

DETAILED DESCRIPTION OF THE INVENTION

A method for the quantitative determination of silicone oil or siloxanes in trace quantities in silicas or pyrogenic oxides by the quantitative evaluation of $^1$H-NMR spectra by dispersing the silica or pyrogenic oxide in an organic solvent, and then, after isolating the solids, evaporating the clear phase to dryness and, after taking up the residue in a deuterated solvent, quantitatively evaluating the silicone oil or siloxane via the integral of the methyl silyl protons indicated on the $^1$H-NMR spectrum.

The following example serves to explain one embodiment of the present invention in more detail. This example is not to be construed as being exhaustive or exclusive as to the scope of this invention. Modifications and equivalents will be apparent to practitioners skilled in this art and are encompassed within the spirit and scope of the appended claims.

EXAMPLE

Determining Silicone Oil in AEROSIL® R 805 by $^1$H-NMR Spectroscopic Evaluation 8 grams of AEROSIL® R 805 (fumed silica from Degussa AG) are dispersed in 140 g of n-hexane for 10 minutes, using a dissolver (diameter of dispersing disc 40 mm, 2500 rpm).

The dispersion is centrifuged for 7 minutes using a high-power centrifuge at 14,000 rpm.

The clear phase is decanted into a 250 ml round-bottomed flask and this decanted fraction is gravimetrically determined and the percentage, with respect to the 140 g of hexane initially used, is then calculated.

The clear phase is evaporated to dryness on a rotary evaporator at 30° C.

The residue is taken up in 2 portions of CDCl$_3$ and transferred to a glass $^1$H-NMR tube; if required further small amounts of $CDCl_3$ are added to the NMR tube so that it is filled to a depth of 8 cm.

The $^1$H-NMR spectrum is recorded on a 500 MHz instrument and the integral of the proportion of silicone oil signals in the 0 ppm region is determined by normalizing the $CHCl_3$ signal, as an internal standard, to 100. The methyl silyl signal integral is corrected in accordance with the factor determined as above.

The quantitative silicone oil concentration is read from a calibration line which has been determined using AEROSIL® R 805 samples doped with known concentrations of silicone oil.

Figure 1:
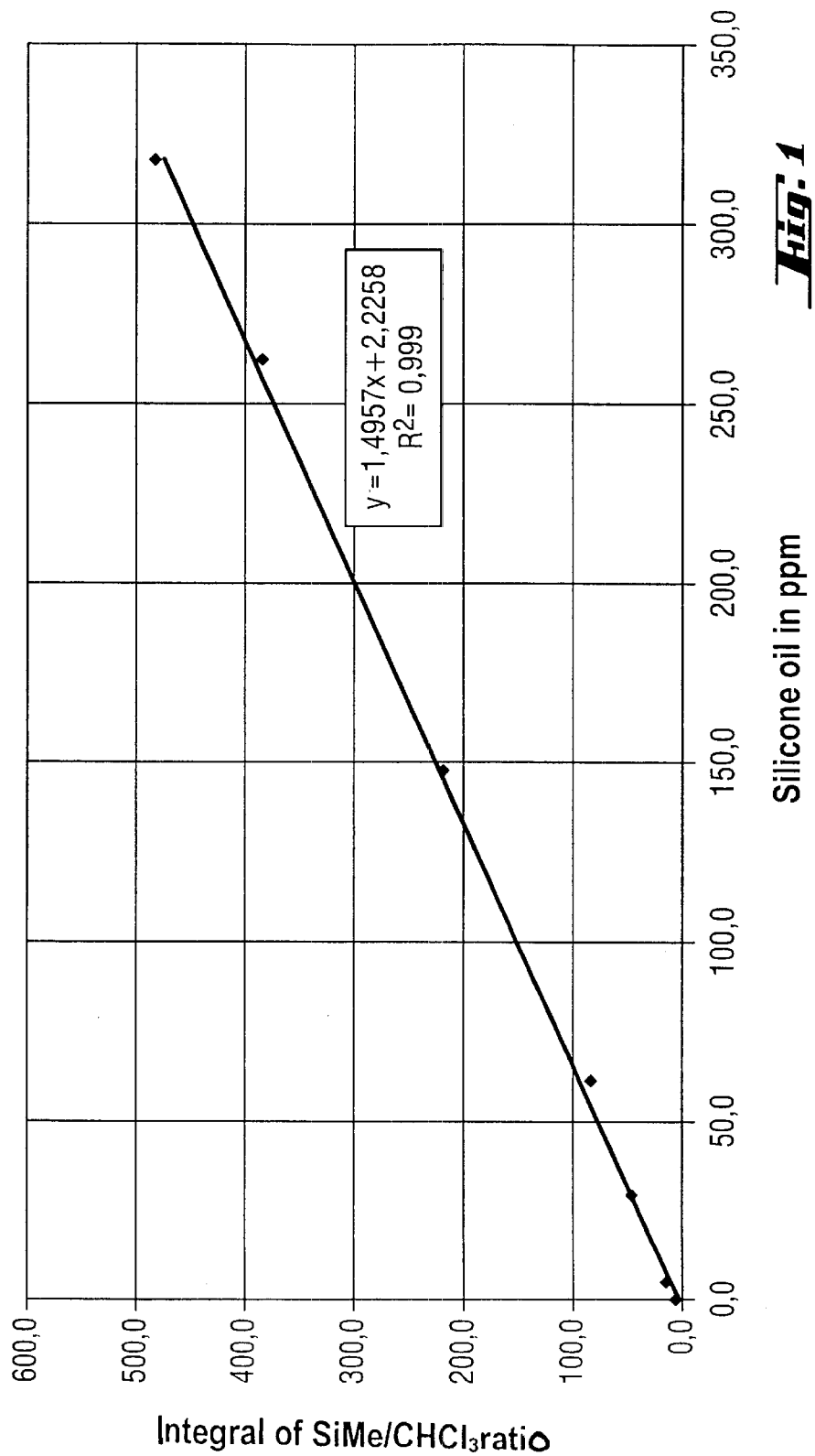
FIG. 1 is an illustration of the relationship between the concentration of silicone oil in ppm versus the integral of the SiMe/CHCl$_3$ ratio.
Figure 2:
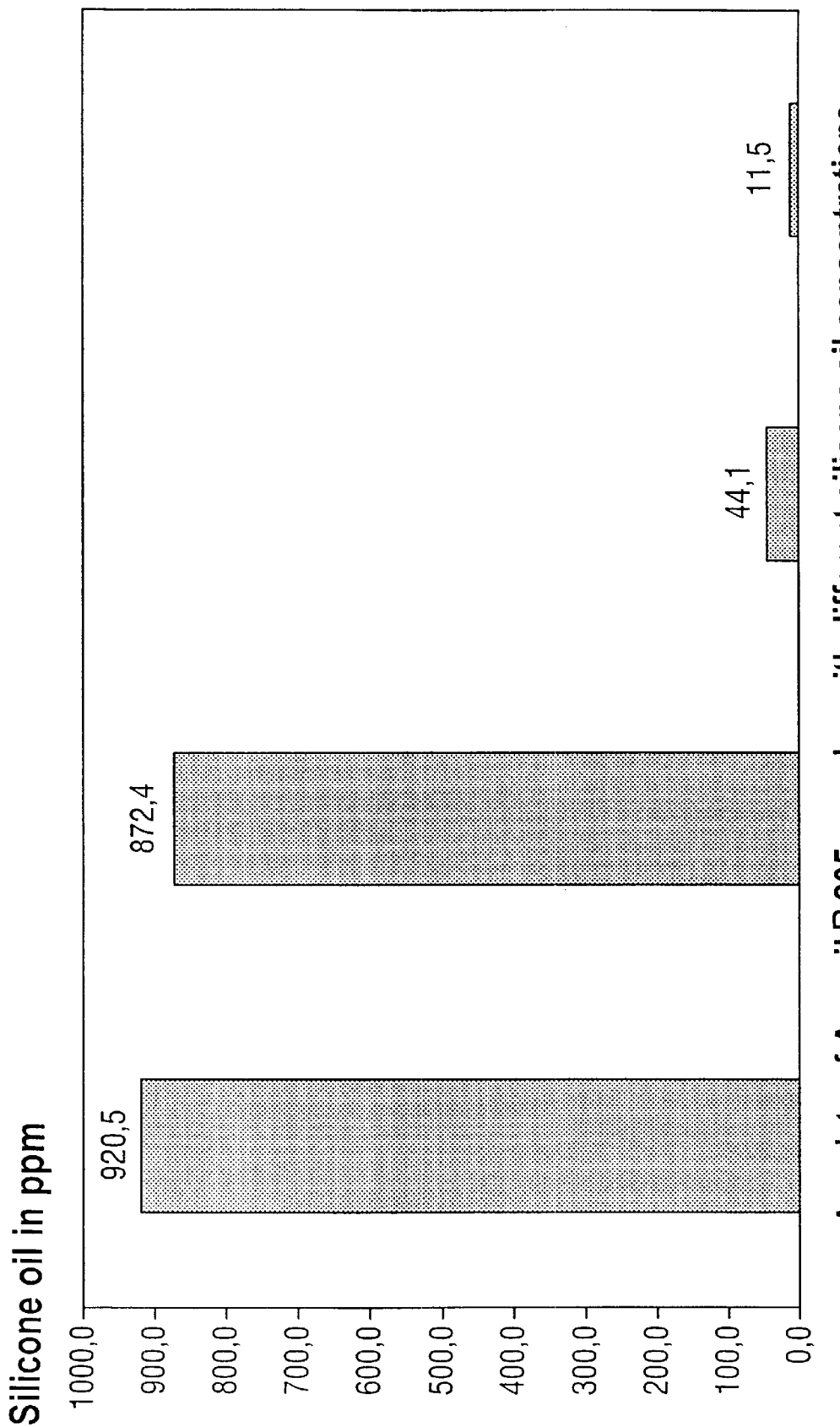
FIG. 2 illustrates AEROSIL® R 805 samples with different silicone oil concentrations as determined by the present method.
Figure 3:
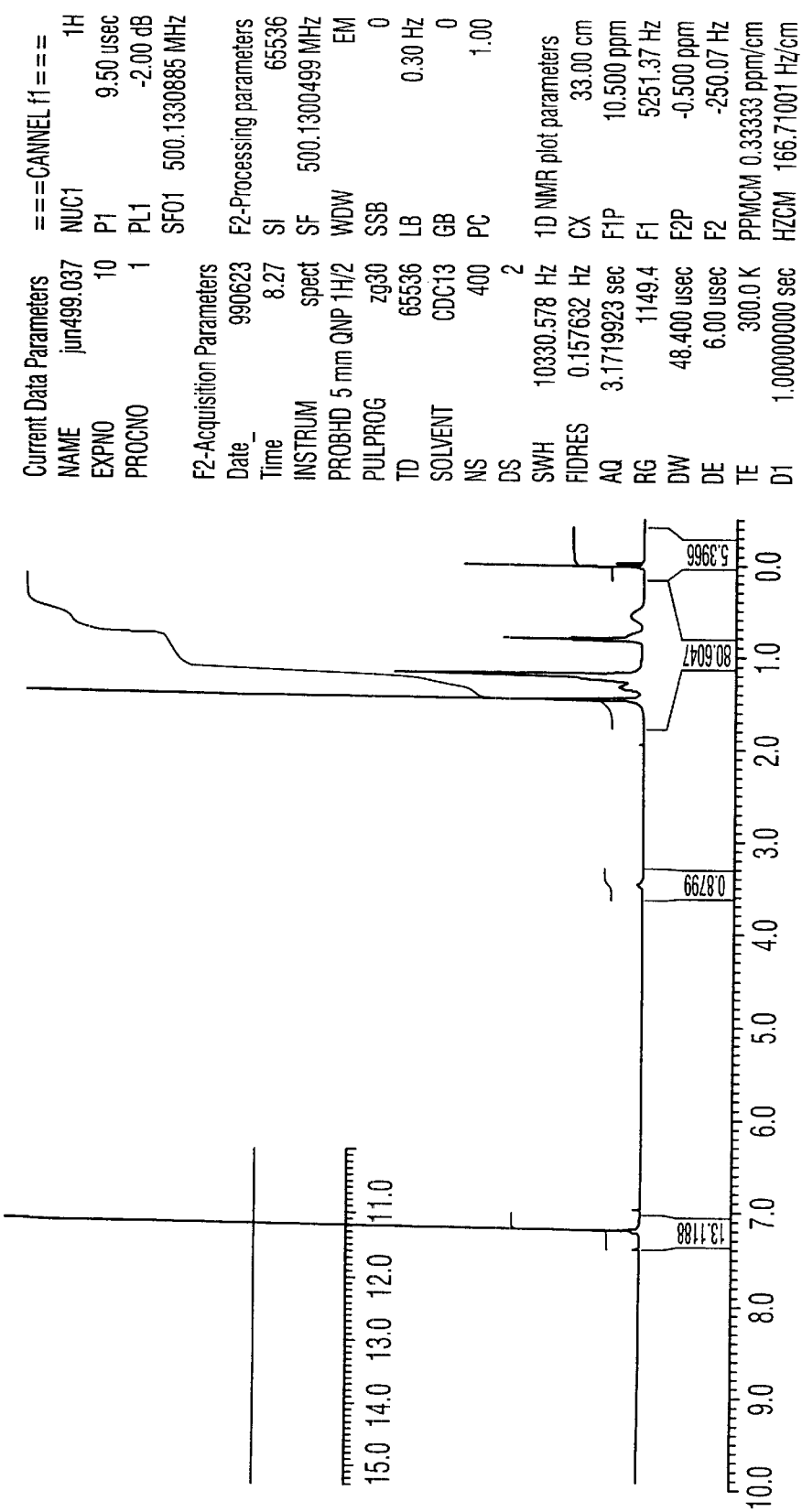
FIG. 3 is the 500 MHz $^1$H-NMR spectra of Example 1.

The results are shown in FIGS. 1 to 3.

What is claimed is:

1. A method for the quantitative determination of silicone oil or siloxanes in trace quantities in silicas or pyrogenic oxides by the quantitative evaluation of $^1$H-NMR spectra by dispersing the silica or pyrogenic oxide in an organic solvent and then, after isolating the solids, evaporating the clear phase to dryness and, after taking up the residue in a deuterated solvent, quantitatively evaluating the silicone oil or siloxane via the integral of the methyl silyl protons indicated on the $^1$H-NMR spectrum.

2. A method according to claim 1, wherein said deuterated solvent is deuterated chloroform.

3. A method according to claim 1, wherein the solid is isolated by decanting.

4. A method for the quantitative determination of silicone oil or siloxanes comprising dispersing a silica in an organic solvent, separating the dispersed silica into a liquid phase and a solid phase, isolating the liquid phase, evaporating the liquid phase to a residue, dissolving the residue in a deuterated solvent, and determining the concentration of methyl silyl protons in the residue by $^1$H-NMR spectroscopy.

5. A method according to claim 4, wherein said organic solvent is hexane.

6. A method according to claim 4, wherein said deuterated solvent is deuterated chloroform.

7. A method according to claim 4, wherein the liquid phase is separated by decanting.

8. A method for the quantitative determination of silicone oil or siloxanes in a pyrogenic oxide comprising dispersing a pyrogenic oxide in an organic solvent, separating the dispersed pyrogenic oxide into a liquid phase and a solid phase, isolating the liquid phase, evaporating the liquid phase to a residue, dissolving the residue in a deuterated solvent, determining the concentration of methyl silyl protons in the residue by $^1$H-NMR spectroscopy, and correlating the concentration of methyl silyl protons to the concentration of silicone oil or siloxanes.

9. A method according to claim 8, wherein said organic solvent is hexane.

10. A method according to claim 8, wherein said deuterated solvent is deuterated chloroform.

11. A method according to claim 8, wherein the liquid phase is separated by decanting.

12. A method according to claim 8, wherein the pyrogenic oxide is filmed silica.

* * * * *